United States Patent [19]

Abbott

[11] 4,363,778

[45] Dec. 14, 1982

[54] MONITOR CIRCUIT FOR A CONTROL ROD DRIVE MECHANISM

[75] Inventor: Robert L. Abbott, Richland, Wash.

[73] Assignee: The Babcock & Wilcox Company, New Orleans, La.

[21] Appl. No.: 149,966

[22] Filed: May 15, 1980

[51] Int. Cl.³ .................... G21C 17/00; G21C 7/08
[52] U.S. Cl. .............................. 376/228; 376/258; 376/245; 376/215
[58] Field of Search .................. 176/19 R, 19 EC, 24, 176/36 R; 376/215, 245, 228, 258

[56] References Cited

U.S. PATENT DOCUMENTS

| | | | |
|---|---|---|---|
| 4,028,686 | 6/1977 | Wilson et al. | 340/195 |
| 4,034,277 | 7/1977 | Leenhouts | 718/685 |
| 4,054,486 | 10/1977 | Lefebvre et al. | 176/19 EC |
| 4,103,233 | 7/1978 | Timmermanns et al. | 176/19 EC |
| 4,125,432 | 11/1978 | Brooks, Jr. et al. | 176/19 EC |
| 4,170,754 | 10/1979 | Schmitz et al. | 176/19 R |
| 4,201,940 | 5/1980 | Pardenne | 176/36 R |

Primary Examiner—Sal Cangialosi
Attorney, Agent, or Firm—Harness, Dickey & Pierce

[57] ABSTRACT

A monitor circuit for a control rod drive mechanism (CRDM) that is adapted to detect erroneous stator phase sequences and generate a visible and audible alarm. The monitor circuit has particular application for use in connection with the control element assembly of a nuclear reactor. The monitor circuit includes an interface circuit for each stator phase winding of the drive motor, a plurality of logic gates to detect the predetermined erroneous phase sequences, a plurality of flip-flops to maintain the fault condition signal, visible and audible alarm circuits, and circuitry for resetting the monitor circuit after a fault condition. The monitor circuit also includes a ratchet trip circuit for disengaging the clutch mechanism from the control rods when the rods are in motion in the time a fault condition is detected.

6 Claims, 5 Drawing Figures

MONITOR CIRCUIT FOR A CONTROL ROD DRIVE MECHANISM

BACKGROUND AND SUMMARY OF THE INVENTION

The present invention relates to a monitor circuit for a control rod drive system of the type utilized to control the energy output of a nuclear reactor, and in particular to a monitor circuit that is adapted to detect erroneous stator phase sequences in any of the power supplies in the control rod drive system.

The reactor core of a nuclear reactor contains an array of control rods which are typically divided into eight groups. The reactor core is comprised of four quadrants with the control rods from each group being symmetrically distributed about the core. Each group, therefore, may contain either four, eight, or twelve individual control rods with either one, two, or three control rods, respectively, being disposed in each quadrant.

The control rods in a fission-type nuclear reactor are utilized to regulate the fission process in the reactor core by absorbing neutrons which would otherwise be available for fission production. Therefore, it will be appreciated that the power output of the reactor is regulated by controlling the depth of insertion of the control rods into the reactor core. Each control rod in the reactor core has associated therewith a control rod drive mechanism (CRDM) which is operative to control the vertical position of the control rod. Typically, the CRDMs utilized in a nuclear reactor include six-phase d.c. stepper motors which are adapted to revolve in discrete increments as the various stator phase windings of the motor are sequentially energized. In order to maintain the symmetry of the reactor core, it is important that all the control rods in each group are moved in unison. Accordingly, all of the CRDMs in a group are generally powered by a single power supply. Thus, for a reactor core having eight control rod groups, there would be eight separate polyphase power supplies.

The stator phase windings for a six-phase d.c. stepper motor are evenly spaced 60° apart and are designated $\phi A$, $\phi B$, $\phi C$, $\phi AA$, $\phi BB$, and $\phi CC$. Phase shifts are implemented in 30° increments by sequentially energizing adjacent combinations of stator phase windings. An erroneous phase shift in the power supply can produce what is referred to as a "ratchet condition" if the CRDM is running at the time of the fault. The term "ratchet condition" refers to a condition wherein the clutch in the CRDM which couples the motor to the control rod is momentarily disengaged from the control rod by the fault sequence and then immediately re-engaged upon the succeeding phase shift in the power supply. Due to the weight of the control rod, the CRDM may be unable to halt the control rod from dropping into the reactor core despite the re-engagement of the clutch. Consequently, the jaws of the clutch will slip or "ratchet" over the threads of the control rod thereby potentially causing damage to the control rods.

Accordingly, it is the primary object of the present invention to provide a monitor circuit for a control rod drive mechanism that is adapted to detect abnormal phase sequences in the group power supply for the CRDMs.

In addition, it is another object of the present invention to provide a monitor circuit which is further adapted to produce a non-destructive trip condition upon the detection of a group power sequence fault which is effective to de-energize the entire power supply for the affected group in the event the fault sequence occurs when the CRDMs in the group are running.

Furthermore, it is an object of the present invention to provide a monitor circuit that is adapted to detect an abnormal phase sequence in a group power supply and store the fault condition for identification.

Additional objects and advantages of the present invention will become apparent from a reading of the detailed description of the preferred embodiment which makes reference to the following set of drawings in which:

DETAILED DESCRIPTION OF THE PREFERRED EMBODIMENT

Figure 1:
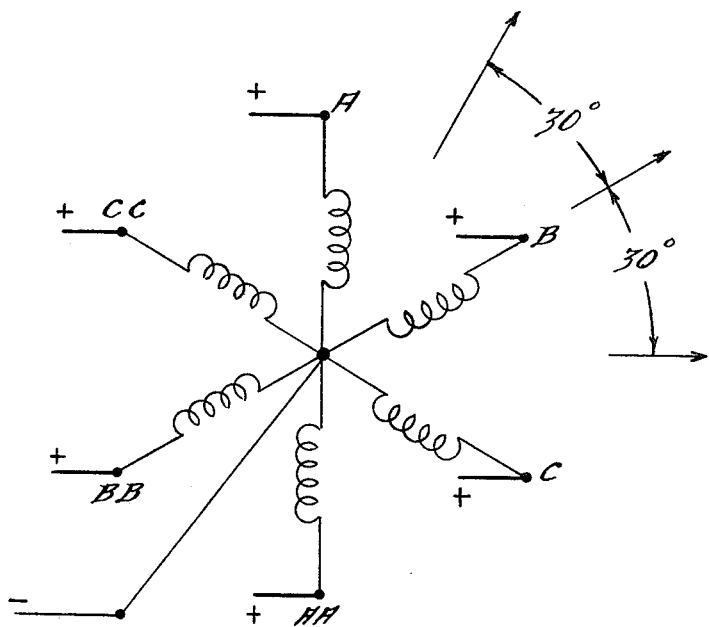
FIG. 1 is a schematic representation of the stator phase windings of a six-phase d.c. control rod drive motor.

Referring now to the drawings, the monitor circuit in the preferred embodiment of the present invention is adapted to detect nine different abnormal phase sequences which would otherwise produce a "ratchet" condition if the control rod drive mechanisms were operative at the time of the fault occurrences. In addition, the monitor circuit is adapted to produce an annunciator signal upon the detection of a fault condition and store the fault condition for identification.

Figure 2:
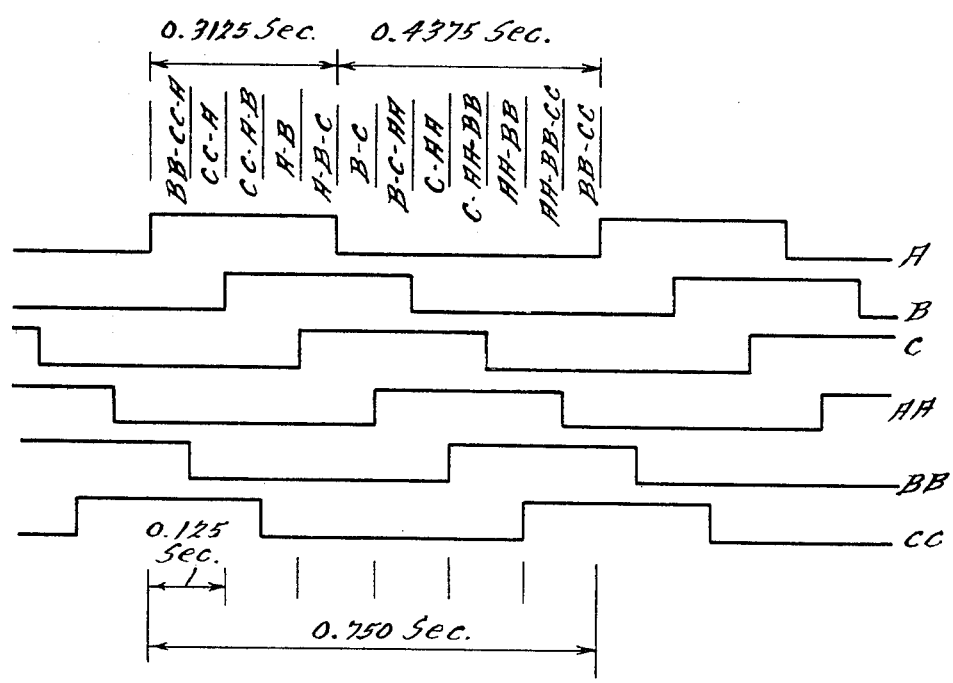
FIG. 2 is a timing diagram of a typical "run" speed stator phase shifting sequence.

A schematic representation of the six stator phase windings in a d.c. stepper motor of the type utilized in control rod drive mechansims is illustrated in FIG. 1. The stator phase windings are equally spaced 60° apart and are designated $\phi A$, $\phi B$, $\phi C$, $\phi AA$, $\phi BB$, and $\phi CC$. Each phase winding is connected to one of the power lines from a polyphase power supply (not shown), with the return line to the power supply tied in common to each of the phase windings. Phase shifts are implemented by sequentially energizing adjacent combinations of phase windings to achieve 30° vector increments. In particular, as the timing diagram in FIG. 2 illustrates, the complete 360° vector movement is comprised of twelve proper phase sequences, which can be logically represented as follows:

| | |
|---|---|
| $\phi A \cdot \phi B$ | $\phi AA \cdot \phi BB$ |
| $\phi A \cdot \phi B \cdot \phi C$ | $\phi AA \cdot \phi BB \cdot \phi CC$ |
| $\phi B \cdot \phi C$ | $\phi BB \cdot \phi CC$ |
| $\phi B \cdot \phi C \cdot \phi AA$ | $\phi BB \cdot \phi CC \cdot \phi A$ |
| $\phi C \cdot \phi AA$ | $\phi CC \cdot \phi A$ |
| $\phi C \cdot \phi AA \cdot \phi BB$ | $\phi CC \cdot \phi A \cdot \phi B$ |

Thus, nine erroneous or abnormal phase sequences can be identified which should not occur during normal operation. The energization of any phase and its opposite phase, and the energization of any phase without at least one of its adjacent phases. Thus, the nine fault phase sequences can be logically identified as follows:

| | | |
|---|---|---|
| $\phi A \cdot \phi AA$ | $\overline{\phi CC} \cdot \phi A \cdot \phi \overline{B}$ | $\phi \overline{C} \cdot \phi AA \cdot \overline{\phi BB}$ |
| $\phi B \cdot \phi BB$ | $\phi \overline{A} \cdot \phi B \cdot \phi \overline{C}$ | $\overline{\phi AA} \cdot \phi BB \cdot \overline{\phi CC}$ |
| $\phi C \cdot \phi CC$ | $\phi \overline{B} \cdot \phi C \cdot \overline{\phi AA}$ | $\overline{\phi BB} \cdot \phi CC \cdot \phi \overline{A}$ |

The bar over the phase identification is a "logical not" designation indicating that the phase is not energized.

Figure 3:
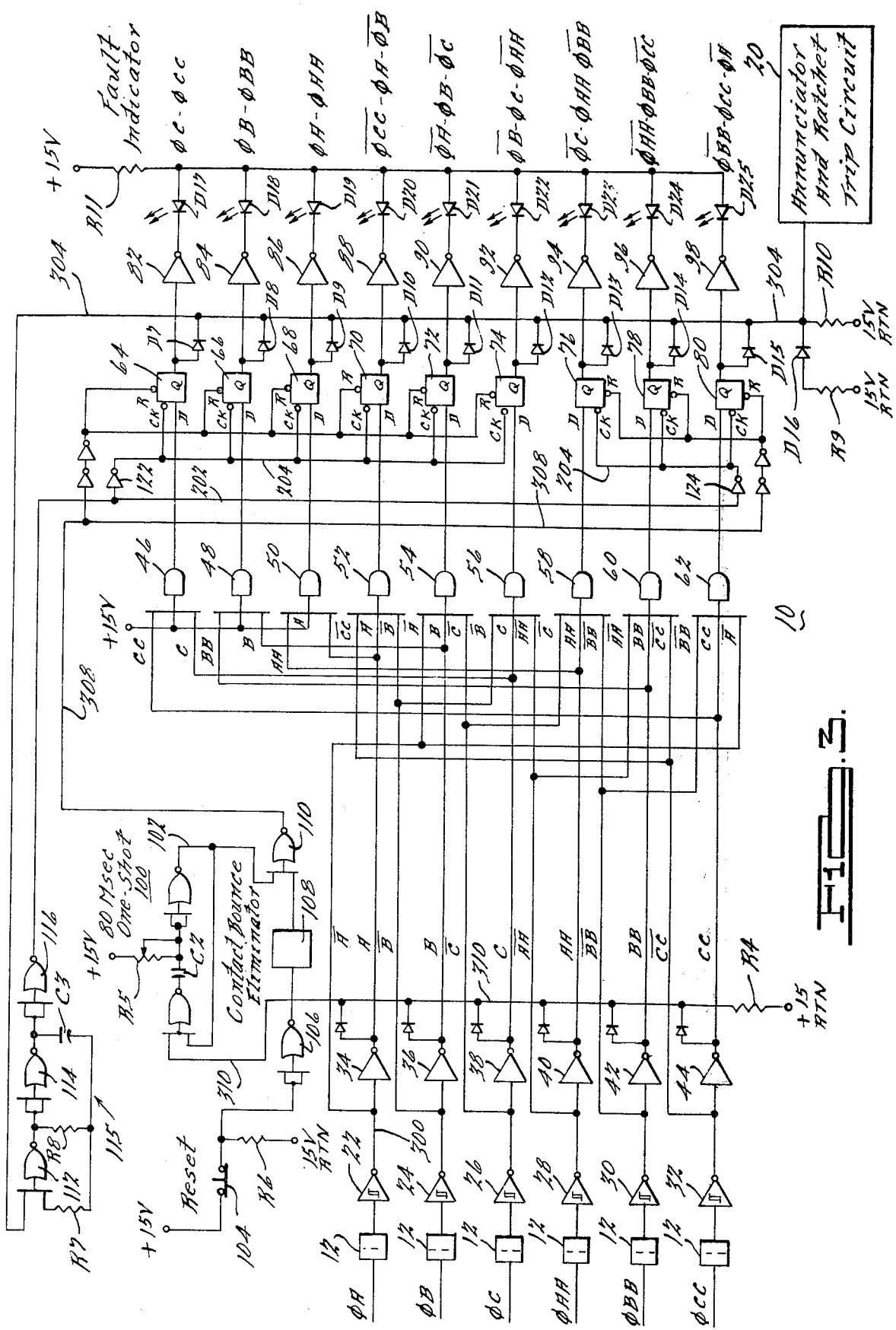
FIG. 3 is a circuit diagram of a monitor circuit according to the present invention.

Referring now to FIG. 3, a circuit diagram of a monitor circuit 10 according to the present invention is shown. A monitor circuit equivalent to that shown is required for each group power supply in the system. Thus, for the typical nuclear reactor core, eight such monitor circuits would be required. Basically, the monitor circuit 10 comprises an interface circuit 12 (shown in detail in FIG. 4) for each phase line from the group power supply, a plurality of AND-gates 46–62 for detecting the nine identified erroneous stator phase sequences, a plurality of D-type flip-flops 64–80 for maintaining a fault condition once detected, and a plurality of light-emitting diodes (LEDs) D17–D25 for providing a visual identification of the particular fault sequence detected. Further fault detection signal processing is provided by an annunciator and ratchet trip circuit 20, shown in block diagram form in FIG. 3 and illustrated in detail in FIG. 5. As will subsequently be described in greater detail, the annunciator and ratchet trip circuit 20 is adapted to produce an audible indication of a fault condition, and includes means for providing a fault signal at a remote location. In addition, the circuit 20 is also adapted to produce an anti-ratchet "trip" signal when the control rods are in motion at the time a fault condition is detected which is effective to disable the CRDMs and allow the control rod group to fall cleanly into the reactor core.

Figures 4, 5:
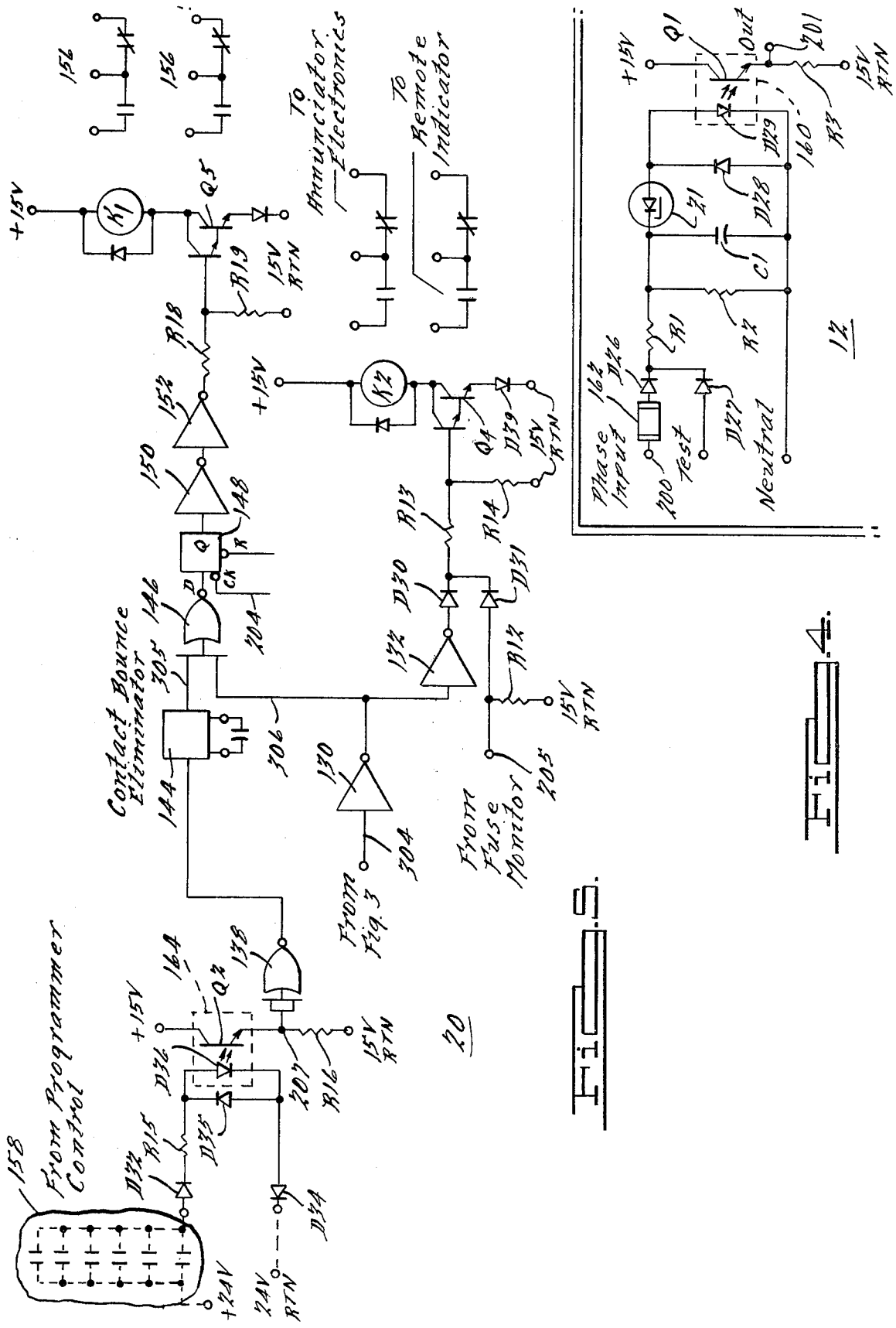
FIG. 4 is a circuit diagram of an interface circuit for receiving voltage pulses from a control rod group power supply.
FIG. 5 is a circuit diagram of an annunciator and ratchet trip circuit for providing an audible indication of a fault condition and for releasing the control rods in the event that a fault condition is detected when the control rod group is in motion.

With particular reference to FIG. 4, a circuit diagram of the interface circuit 12 is shown. There are six of these circuits in the monitor circuit 10, one for each phase line from the group power supply. The interface circuit 12 converts the 125 volt signal from the phase line off the group power supply to a corresponding digital signal which is HI when the phase is energized and LO when the phase is not energized. In particular, the phase voltage signal received at input 200 is provided through fuse 162 and diode D27 to a voltage divider network comprised of resistors R1 and R2. The voltage divider network serves to step-down the phase voltage from 125 volts to approximately 12 volts. The stepped-down voltage signal is then filtered by capacitor C1 and provided through a zener diode Z1 to a light-emitting diode D29 which is optically coupled to a photo-transistor Q1. The presence of the zener diode Z1 establishes a minimum current flow which must be exceeded in order to "breakover" the zener diode and energize LED D29. Light-emitting diode D29 and phototransistor Q1 serve to optically isolate the remainder of the digital logic circuitry in the monitor circuit 10 from the high voltage on the phase lines from the group power supply. Thus, it will be appreciated that when a phase voltage signal is present at input 200, LED D29 will be energized, thereby rendering conductive phototransistor Q1 and producing a logic HI signal at output 201. Similarly, when a phase voltage signal is not present at input 200, LED D29 is not energized, photo-transistor Q1 is non-conductive, and a logical LO signal is present at output 201.

Returning to FIG. 3, the digital output signals from the interface circuits 12 are each provided to a wave-shaping hysteresis-type inverter 22–32. Thus, it will be appreciated that the digital signals at the outputs of inverters 22–32 correspond to the inverted logic functions of the phase signals; i.e., $\overline{A}, \overline{B}, \overline{C}, \overline{AA}, \overline{BB}$, and $\overline{CC}$. In addition, each of the outputs from inverters 22–32 is provided to another inverter, 34–44 respectively, to provide the non-inverted logic function for each phase; i.e., A, B, C, AA, BB, and CC.

The twelve output lines from inverters 22–32 and inverters 34–44 are provided in the appropriate combinations to the inputs of nine AND gates 46–62 which serve to detect each of the nine fault conditions previously noted. In other words, each of the nine AND gates 46–62 is adapted to produce a logical HI output signal whenever its particular fault condition occurs. Thus, as can be seen from the circuit diagram, AND gate 46 is adapted to detect the phase sequence fault C·CC, AND gate 48 is adapted to detect the phase sequence fault B·BB, AND gate 50 is adapted to detect the phase sequence fault A·AA, AND gate 52 is adapted to detect the phase sequence fault $\overline{CC} \cdot A \cdot \overline{B}$, AND gate 54 is adapted to detect the phase sequence fault $\overline{A} \cdot B \cdot \overline{C}$, AND gate 56 is adapted to detect the phase sequence fault $\overline{B} \cdot C \cdot \overline{AA}$, AND gate 58 is adapted to detect the phase sequence fault $\overline{C} \cdot AA \cdot \overline{BB}$, AND gate 60 is adapted to detect the phase sequence fault $\overline{AA} \cdot BB \cdot \overline{CC}$, and AND gate 62 is adapted to detect the phase sequence fault $\overline{BB} \cdot CC \cdot \overline{A}$.

The outputs of AND gates 46–62 are each connected to the data (D) input of a D-type flip-flop, 64–80 respectively. The clock (CK) input of each flip-flop 64–80 is connected through an inverter, 122 or 124, to the CLOCK line 202 from the output of a 100 KHz clock circuit 115. The clock circuit 115 consists of a conventional square-wave oscillator comprised of NOR gates 112, 114 and 116, a capacitor C3, and a pair of resistors R7 and R8. The values of resistors R7 and R8 and capacitor C3 are selected to produce the 100 KHz clock frequency. The purpose of the flip-flops 64–80 is to store a fault condition detected by any of the AND gates 46–62. Specifically, whenever any of the outputs from AND gates 46–62 goes HI, the HI signal provided to the data (D) input of the corresponding flip-flop 64–80 will upon receipt of the next clock pulse off line 202 get clocked through to the Q output of the flip-flop. In addition, it will be noted that the Q outputs from the flip-flops 64–80 are tied through diodes D7–D15 in common to line 304 which is provided back to the input of NOR gate 112 in clock circuit 115. The purpse of this connection is to disable the clock circuit 115 and hence prevent the production of additional clock pulses once a fault condition has been detected and stored in one of the flip-flops 64–80. This serves to insure that the fault detection will not get "lost" after the output of the affected AND gate goes LO.

Each of the Q outputs of flip-flops 64–80 is also connected through an inverter 82–98 to a light-emitting diode D17–D25, respectively. The anode side of the LEDs D17–D25 are tied in common through a resistor R11 to a +15 volts source. Thus, whenever a fault condition is detected and stored in one of the flip-flops 64–80, the outputs of the corresponding inverter 82–98 will go LO and forward bias its respective LED D17–D25 to thereby provide a visual identification of the fault condition.

In addition, whenever a fault condition is detected, the HI signal on line 304 is also provided to the annunciator and ratchet trip circuit 20. With particular reference to FIG. 5, the signal on line 304 is provided through an inverter 130 to one of the inputs of a NOR gate 146. The other input of NOR gate 146 is connected to line 305 which is adapted to go LO whenever the group CRDMs are in the run mode. Specifically, at least one of the power supply phase lines will of course be energized any time the group CRDMs are running. Hence, at least one of the six contacts 158 from the programmer control (not shown) will be closed when in the run mode, thus providing a 24 volt signal through resistor R15 to an optical coupler 164 comprised of LED D36 and phototransistor Q2. With LED D36 energized, photo-transistor Q2 is rendered conductive and a logical HI signal is provided to the input of NOR gate 138. NOR gate 138 simply inverts the signal to a logical LO which in then provided on line 305 to the input of NOR gate 146 through a contact bounce eliminator 144. Thus, it will be appreciated that when the group CRDMs are in the run mode the signal on line 305 is LO and when the control rods are not in motion the signal on line 305 is HI.

The output of NOR gate 146 is provided to the data (D) input of a D-type flip-flop which has its clock (CK) input tied to the same inverted clock line 204 which clocks flip-flops 64–80. Consequently, whenever the group is in the run mode when a fault condition is detected, the LO signal on line 306 is inverted by NOR gate 146 and the resulting HI signal at the data (D) input of flip-flop 148 is clocked through to the Q output of flip-flop 148. The HI signal at the Q output of flip-flop 148 is thereafter provided through a pair of inverters 150 and 152 and a voltage divider comprised of resistors R18 and R19 to a Darlington driver Q5 which is connected to a relay coil K1. Energization of relay coil K1 serves to switch the state of relay contacts 156, thereby producing a "trip" signal which is effective to de-energize the CRDMs, disengaging the clutch mechanisms from the control rods and permitting the control rods to fall cleanly into the reactor core. The purpose of flip-flop 148 is to maintain the trip signal once the fault condition has been detected.

In a similar fashion, the LO "fault" signal on line 306 is also inverted by inverter 132 and the resulting HI signal provided to another Darlington driver Q4 through diode D30 and a voltage divider network comprised of resistors R13 and R14. The Darlington driver Q4 is connected to a second relay coil K2 which when energized changes the state of relay contacts 158, which serves to activate the annunciator electronics to produce an audible alarm and also activate a remote fault indicator.

Returning again to FIG. 3, once a fault sequence has been detected, the monitor circuit 10 will store the fault for identification purposes until the RESET button 104 is actuated. The RESET button 104 is normally closed which serves to provide a HI signal to the input of a NOR gate inverter 106. The resulting normally LO signal from the output of NOR gate 106 is provided through a contact bounce eliminator 108 to the input of another NOR gate 110, which again inverts the signal so as to provide a normally HI signal on line 308. Line 308 serves as the reset signal line and is connected to the reset (R) terminal of each of the flip-flops 64–80 and 148 (FIG. 5). When the signal on line 308 goes LO, all of the flip-flops 64–80 and 148 are reset. Thus, it can be seen that when the RESET button 104 is depressed, the input to inverter 106 goes LO causing its output to go HI and in turn causing the output of NOR gate 110 to go LO, thereby resetting the flip-flops 64–80 and 148.

In addition, in order to insure that the monitor circuit 10 does not erroneously detect a fault sequence upon initial start-up before the phase lines have stabilized, a reset pulse of predetermined duration, herein 80 msec., is automatically produced on line 308 each time the circuit is initially energized. Specifically, upon energization of the group power supply the signal on line 310 will transition to a logical HI, thus enabling a one-shot multivibrator circuit 100 which is adapted when triggered to provide a HI signal pulse on line 102 to the input of NOR gate 110, resulting in a LO reset pulse being produced on reset line 308. The duration of the reset pulse is set at 80 msec. by the values of capacitor C2 and variable resistor R5. Thereafter, the signal on line 310 will remain HI as long as the group power supply remains energized, thereby preventing the one-shot circuit 100 from retriggering and producing another reset pulse.

While the above description constitutes the preferred embodiment of the present invention, it will be appreciated that the invention is susceptible to modification, variation and change without departing from the proper scope or fair meaning of the accompanying claims.

I claim:

1. In a nuclear reactor having a plurality of control rods distributed within the reactor core and a corresponding plurality of control rod drive mechanisms (CRDMs) for controlling the positioning of the control rods including six phase stepper motors having six symmetrically arranged stator phase windings and a polyphase power supply for sequentially energizing appropriate combinations of said stator phase windings to cause said motors to revolve in discrete radial increments; a monitor circuit for monitoring the phase sequencing of said power supply including:
    digital circuit means responsive to the energization of the phase lines connected to said stator phase windings for detecting nine erroneous phase combinations indicative of a fault condition including the energization of any stator phase and its opposite stator phase and the energization of any stator phase and neither of its two adjacent stator phases, and trip circuit means responsive to said digital circuit means for producing a trip signal that is effective to de-energize said CRDMs only if said CRDMs are running when a fault condition is detected.

2. The monitor circuit of claim 1 wherein said digital circuit means includes storage means for storing the fault condition detected.

3. The monitor circuit of claim 1 wherein said trip circuit means is further adapted to maintain the production of said trip signal after said CRDMs are de-energized.

4. The monitor circuit of claim 1 further including signal means responsive to the detection of a fault condition by said digital logic circuit means for producing a perceptible fault signal.

5. The monitor circuit of claim 1 wherein said digital circuit means includes interface circuit means for producing digital signals indicative of the presence or absence of a supply signal on each of said phase lines.

6. The monitor circuit of claim 5 wherein said interface circuit means includes optical coupling means for isolating said digital circuit means from said power supply.

* * * * *